(12) United States Patent
Asaba et al.

(10) Patent No.: US 12,513,923 B2
(45) Date of Patent: Dec. 30, 2025

(54) SEMICONDUCTOR DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shunsuke Asaba, Himeji Hyogo (JP); Katsuhisa Tanaka, Himeji Hyogo (JP); Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 716 days.

(21) Appl. No.: 17/890,489

(22) Filed: Aug. 18, 2022

(65) Prior Publication Data

US 2023/0299212 A1 Sep. 21, 2023

(30) Foreign Application Priority Data

Mar. 18, 2022 (JP) .................................. 2022-043923

(51) Int. Cl.
*H01L 29/872* (2006.01)
*H10D 8/60* (2025.01)
(Continued)

(52) U.S. Cl.
CPC ............. *H10D 8/60* (2025.01); *H10D 62/106* (2025.01); *H10D 62/8325* (2025.01)

(58) Field of Classification Search
CPC .... H10D 8/60; H10D 62/106; H10D 62/8325; H10D 30/668; H10D 62/111; H10D 62/127; H10D 62/393; H10D 84/146
See application file for complete search history.

(56) References Cited

U.S. PATENT DOCUMENTS

2010/0096692 A1 4/2010 Saito et al.
2015/0333126 A1* 11/2015 Fukui .................. H10D 12/031
257/77

(Continued)

FOREIGN PATENT DOCUMENTS

JP 2005-333068 A 12/2005
JP 2010098123 A 4/2010
(Continued)

OTHER PUBLICATIONS

Notice of Reasons for Refusal (Office Action) mailed Apr. 25, 2025, in counterpart Japanese Patent Application No. 2022-043923, with English machine translation, 10 pages.

*Primary Examiner* — Jarrett J Stark
(74) *Attorney, Agent, or Firm* — Kim & Stewart LLP (57) ABSTRACT

A semiconductor device includes first, second and control electrodes, and a semiconductor part between the first and second electrode. The semiconductor part includes first and third layers of a first conductive type, and second, fourth and fifth layers of a second conductive type. The first layer extends between the first and second electrodes. The second layer is provided between the first layer and the second electrode. The third layer is partially provided on the second layer between the second layer and the second electrode. A first fourth layer and a second fourth layer are provided in the first layer. The fifth layer is provided between the first layer and the second layer. The fifth layer is partially provided on the first layer between the first fourth layer and the second fourth layer. The control electrode is provided between the second electrode and each of the fourth layers.

14 Claims, 5 Drawing Sheets

(51) Int. Cl.
  *H10D 62/10* (2025.01)
  *H10D 62/832* (2025.01)

(56) References Cited

U.S. PATENT DOCUMENTS

| | | | |
|---|---|---|---|
| 2015/0333168 A1 | 11/2015 | Hirler et al. | |
| 2016/0211354 A1* | 7/2016 | Ikura | H10D 62/133 |
| 2020/0091299 A1* | 3/2020 | Nakamata | H10D 64/01 |
| 2020/0135593 A1* | 4/2020 | Takishita | H10D 8/422 |
| 2020/0212183 A1* | 7/2020 | Utsumi | H10D 30/0297 |
| 2020/0295182 A1* | 9/2020 | Hoshi | H10D 62/8325 |
| 2020/0303494 A1* | 9/2020 | Shimizu | H10D 64/513 |
| 2020/0388704 A1* | 12/2020 | Tominaga | H10D 30/665 |
| 2020/0395456 A1* | 12/2020 | Hoshi | H10D 30/669 |
| 2021/0036116 A1 | 2/2021 | Kyogoku et al. | |
| 2021/0043735 A1* | 2/2021 | Minamisawa | H10D 62/307 |
| 2021/0050420 A1* | 2/2021 | Lee | H10D 30/668 |
| 2021/0074850 A1* | 3/2021 | Tawara | H10D 12/031 |
| 2021/0098620 A1* | 4/2021 | Tominaga | H10D 30/665 |
| 2021/0288156 A1 | 9/2021 | Fukui et al. | |
| 2022/0052170 A1* | 2/2022 | Zeng | H10D 64/513 |
| 2022/0123140 A1* | 4/2022 | Hsieh | H10D 62/111 |
| 2022/0130998 A1* | 4/2022 | Kim | H10D 64/252 |
| 2022/0165629 A1* | 5/2022 | Utsumi | H10D 62/109 |
| 2022/0190114 A1* | 6/2022 | Tawara | H10D 84/144 |
| 2022/0310791 A1* | 9/2022 | Shimizu | H10D 62/8325 |
| 2022/0336602 A1* | 10/2022 | Moon | H10D 62/8325 |
| 2022/0367636 A1* | 11/2022 | Hsieh | H10D 62/142 |
| 2023/0100453 A1* | 3/2023 | Tawara | H10D 30/66 257/77 |
| 2023/0299212 A1* | 9/2023 | Asaba | H10D 62/106 257/77 |
| 2023/0307519 A1* | 9/2023 | Kono | H10D 62/8325 |

FOREIGN PATENT DOCUMENTS

| | | |
|---|---|---|
| JP | 2011-009387 A | 1/2011 |
| JP | 2011-159918 A | 8/2011 |
| JP | 2017-098403 A | 6/2017 |
| JP | 2021-027138 A | 2/2021 |
| JP | 2021-182639 A | 11/2021 |

* cited by examiner

SEMICONDUCTOR DEVICE

CROSS-REFERENCE TO RELATED APPLICATIONS

This application is based upon and claims the benefit of priority from Japanese Patent Application No. 2022-043923, filed on Mar. 18, 2022; the entire contents of which are incorporated herein by reference.

FIELD

Embodiments relate to a semiconductor device.

BACKGROUND

It is required for a power control semiconductor device to reduce on-resistance and improve a switching speed and a current withstand.

DETAILED DESCRIPTION

According to one embodiment, a semiconductor device includes a first electrode, a second electrode, a semiconductor part and a control electrode. The second electrode is apart from the first electrode. The semiconductor part is provided between the first electrode and the second electrode. The semiconductor part includes first to fifth semiconductor layers. The first semiconductor layer of a first conductive type extends between the first electrode and the second electrode. The second semiconductor layer of a second conductive type is provided between the first semiconductor layer and the second electrode. The third semiconductor layer of the first conductive type is partially provided on the second semiconductor layer between the second semiconductor layer and the second electrode. A plurality of fourth semiconductor layers are provided in the first semiconductor layer. The fourth semiconductor layers are of the second conductive type. The fourth semiconductor layers each extend in a first direction directed from the first electrode toward the second electrode. The fourth semiconductor layers are arranged in a second direction orthogonal to the first direction. The fourth semiconductor layers include a first fourth semiconductor layer and a second fourth semiconductor layer adjacent to each other. The fifth semiconductor layer of the second conductive type is provided between the first semiconductor layer and the second semiconductor layer. The fifth semiconductor layer being partially provided on the first semiconductor layer between the first fourth semiconductor layer and the second fourth semiconductor layer. The fifth semiconductor layer connects the first fourth semiconductor layer and the second fourth semiconductor layer. The control electrode is provided between the second electrode and each of the fourth semiconductor layers. The control electrode faces the second semiconductor layer via a first insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
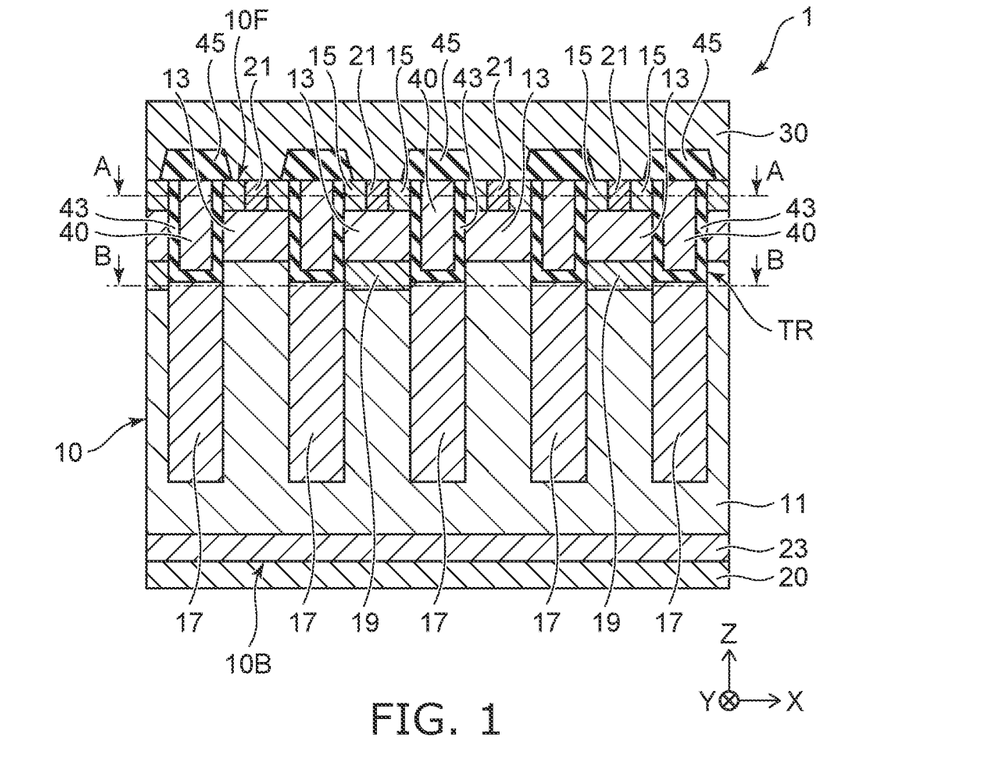
FIG. 1 is a schematic cross-sectional view showing a semiconductor device according to an embodiment.

FIG. 1 is a schematic cross-sectional view showing a semiconductor device 1 according to an embodiment. The semiconductor device 1 is a MOS transistor having a so-called super junction structure.

As shown in FIG. 1, the semiconductor device 1 includes a semiconductor part 10, a first electrode 20, a second electrode 30, and a control electrode 40. The semiconductor part 10 is provided between the first electrode 20 and the second electrode 30. The semiconductor part 10 is, for example, silicon carbide (SiC). The first electrode 20 is provided on a back surface 10B of the semiconductor part 10. The first electrode 20 is, for example, a drain electrode. The second electrode 30 is provided on a front surface 10F of the semiconductor part 10. The second electrode 30 is, for example, a source electrode.

The semiconductor part 10 includes a first semiconductor layer 11 of a first conductive type, a second semiconductor layer 13 of a second conductive type, a third semiconductor layer 15 of the first conductive type, a fourth semiconductor layer 17 of the second conductive type, a fifth semiconductor layer 19 of the second conductive type, a sixth semiconductor layer 21 of the second conductive type, and a seventh semiconductor layer 23 of the first conductive type.

Hereinafter, the first conductive type is described as an n-type and the second conductive type is described as a p-type. The first semiconductor layer 11 is, for example, an n-type drift layer. The second semiconductor layer 13 is, for example, a p-type base layer. The third semiconductor layer 15 is, for example, an n-type source layer. The sixth semiconductor layer 21 is, for example, a p-type contact layer. The seventh semiconductor layer 23 is, for example, an n-type buffer layer. The embodiment is not limited to the example and, for example, may be a structure in which an n-type substrate is interposed between the seventh semiconductor layer 23 and the first electrode 20.

The control electrode 40 is provided in the semiconductor part 10, and is electrically insulated from the semiconductor part by a first insulating film 43. The control electrode 40 is, for example, a gate electrode. The first insulating film 43 is a gate insulating film. The control electrode 40 are provided inside a trench TR. The trench TR is provided on a front surface 10F side of the semiconductor part 10.

For example, the control electrode 40 is provided between the first electrode 20 and the second electrode 30. A second insulating film 45 is provided between the second electrode 30 and the control electrodes 40. The control electrode 40 is electrically insulated from the second electrode 30 by the second insulating film 45. The second insulating film 45 is, for example, an interlayer insulating film.

The first semiconductor layer 11 extends between the first electrode 20 and the second electrode 30. The second semiconductor layer 13 is provided between the first semiconductor layer 11 and the second electrode 30. The third semiconductor layer 15 is partially provided between the second semiconductor layer 13 and the second electrode 30.

As shown in FIG. 1, the fourth semiconductor layer 17 is provided in the first semiconductor layer 11. The fourth semiconductor layers 17 extends in a first direction directed from the first electrode 20 toward the second electrode 30, for example, in the Z-direction.

The semiconductor device 1 includes a plurality of the fourth semiconductor layers 17 and a plurality of the control electrodes 40. The fourth semiconductor layers 17 are arranged in a second direction orthogonal to the first direction, for example, in the X-direction. A so-called super junction structure is configured in the first semiconductor layer 11 by the fourth semiconductor layers 17. That is, a portion of the first semiconductor layer 11 and the fourth semiconductor layer 17 are alternately arranged in the X-direction.

The control electrode 40 is provided between each of the fourth semiconductor layers 17 and the second electrode 30. The control electrode 40 faces the second semiconductor layer 13 via the first insulating film 43 in the X-direction. The third semiconductor layer 15 is in contact with the first insulating film 43. The second semiconductor layer 13 faces the control electrodes 40 between the first semiconductor layer 11 and the third semiconductor layer 15.

The fifth semiconductor layer 19 is partially provided between the first semiconductor layer 11 and the second semiconductor layer 13. The fifth semiconductor layer 19 is provided between two adjacent fourth semiconductor layers 17. The fifth semiconductor layer 19 is connected to the two adjacent fourth semiconductor layers 17. The fifth semiconductor layer 19 is in contact with the second semiconductor layer 13. That is, the fifth semiconductor layer 19 electrically connects the two adjacent fourth semiconductor layers 17 and the second semiconductor layer 13.

The fifth semiconductor layer 19 includes, for example, a second conductive type impurity with a concentration higher than a concentration of a second conductive type impurity in the second semiconductor layer 13. The fifth semiconductor layer 19 includes, for example, the second conductive type impurity with the concentration higher than a concentration of a second conductive type impurity in the fourth semiconductor layer 17.

The sixth semiconductor layer 21 is partially provided on the second semiconductor layer 13 between the second semiconductor layer 13 and the second electrode 30. The third semiconductor layer 15 and the sixth semiconductor layer 21 are arranged, for example, in the X-direction on the second semiconductor layer 13.

The second electrode 30 is connected to the third semiconductor layer 15 and the sixth semiconductor layer 21, for example, at the front surface 10F of the semiconductor part 10. The second electrode 30 is connected to the third semiconductor layer 15 and the sixth semiconductor layer 21 with, for example, an Ohmic junction. The second electrode 30 is electrically connected to the second semiconductor layer 13 via the sixth semiconductor layer 21.

The seventh semiconductor layer 23 is provided between the first semiconductor layer 11 and the first electrode 20. The seventh semiconductor layer 23 includes a first conductive type impurity with a concentration higher than a concentration of a first conductive type impurity in the first semiconductor layer 11. The first semiconductor layer 11 includes another portion provided between each of the fourth semiconductor layers 17 and the seventh semiconductor layer 23.

Figure 2A:
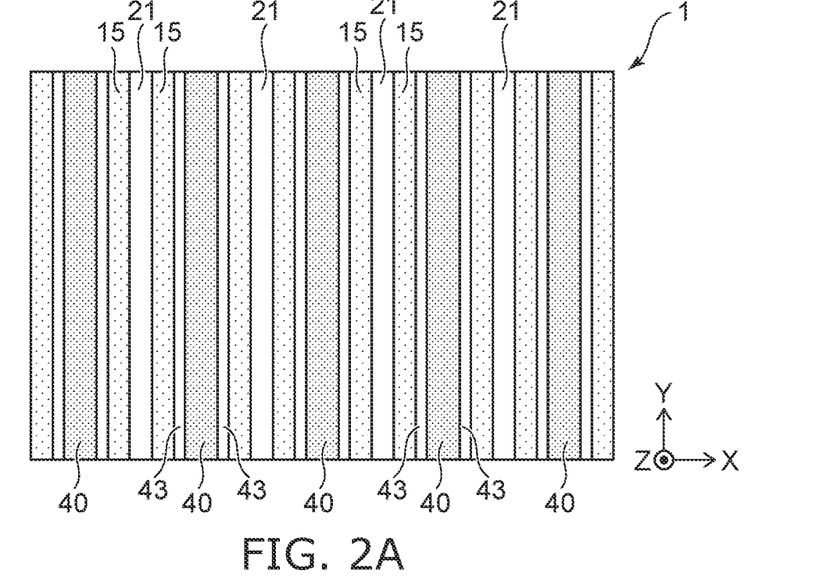
FIGS. 2A and 2B are schematic plan views showing the semiconductor device according to the embodiment.
Figure 2B:
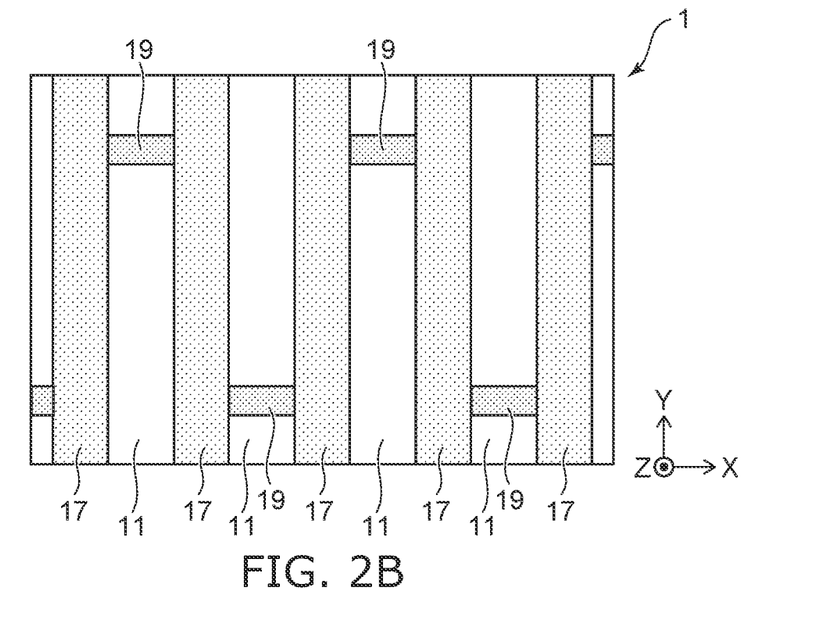

FIGS. 2A and 2B are schematic plan views showing the semiconductor device 1 according to the embodiment. FIG. 2A is a plan view showing a cross section along A-A line in FIG. 1. FIG. 2B is a plan view showing a cross section along B-B line in FIG. 1.

As shown in FIG. 2A, the control electrodes 40 each extend in the Y-direction and are arranged in the X-direction. The third semiconductor layer 15 and the sixth semiconductor layer 21 are arranged between two adjacent control electrodes 40. The third semiconductor layer 15 and the sixth semiconductor layer 21 extend in the Y-direction, respectively.

As shown in FIG. 2B, the fourth semiconductor layers 17 each extend in the Y-direction. The fifth semiconductor layer 19 is partially provided between the two adjacent fourth semiconductor layers 17. The two adjacent fourth semiconductor layers 17 are electrically connected to each other via the fifth semiconductor layer 19.

Accordingly, by providing the fifth semiconductor layer 19 between the two adjacent fourth semiconductor layers 17, the hole rejection via the fourth semiconductor layers 17 can be promoted, and a switching speed is improved, for example, in the turn-off process from an ON-state to an OFF-state.

The fifth semiconductor layer 19 includes the second conductive type impurities with the concentration higher than the concentration of the second conductive type impurities of the second semiconductor layer 13. Therefore, the hole ejection resistance can be reduced in the ejection path to the second electrode 30 via the fifth semiconductor layer 19 and the second semiconductor layer 13. Thereby, an avalanche resistance can be increased around the fifth semiconductor layer 19. Further, it is also possible to increase a capacity for withstanding an overcurrent due to an external surge.

Figure 3A:
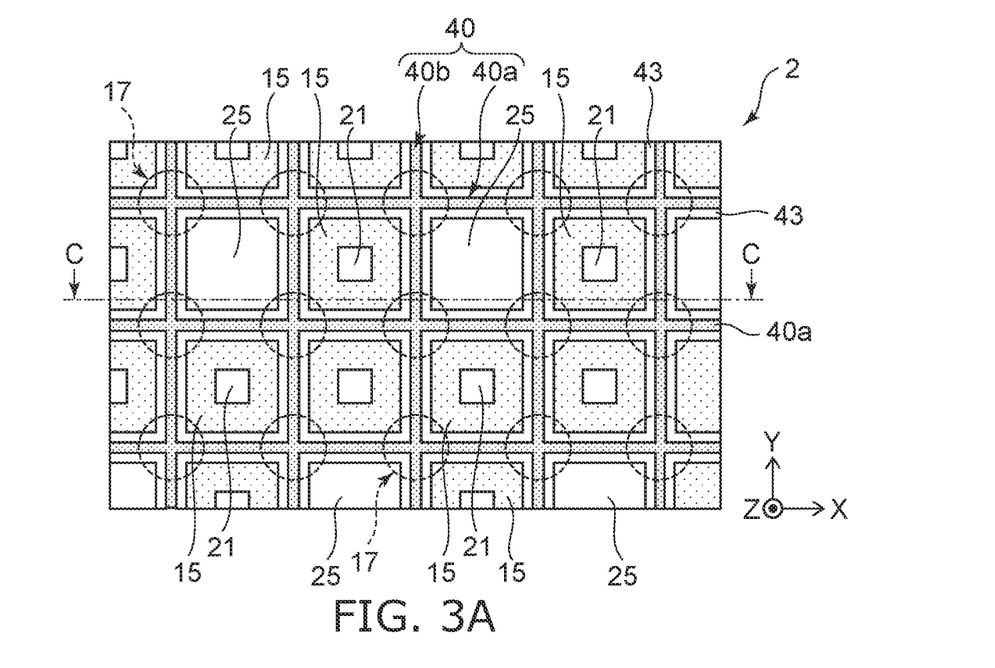
FIGS. 3A and 3B are schematic plan views showing a semiconductor device according to a first variation of the embodiment.
Figure 3B:
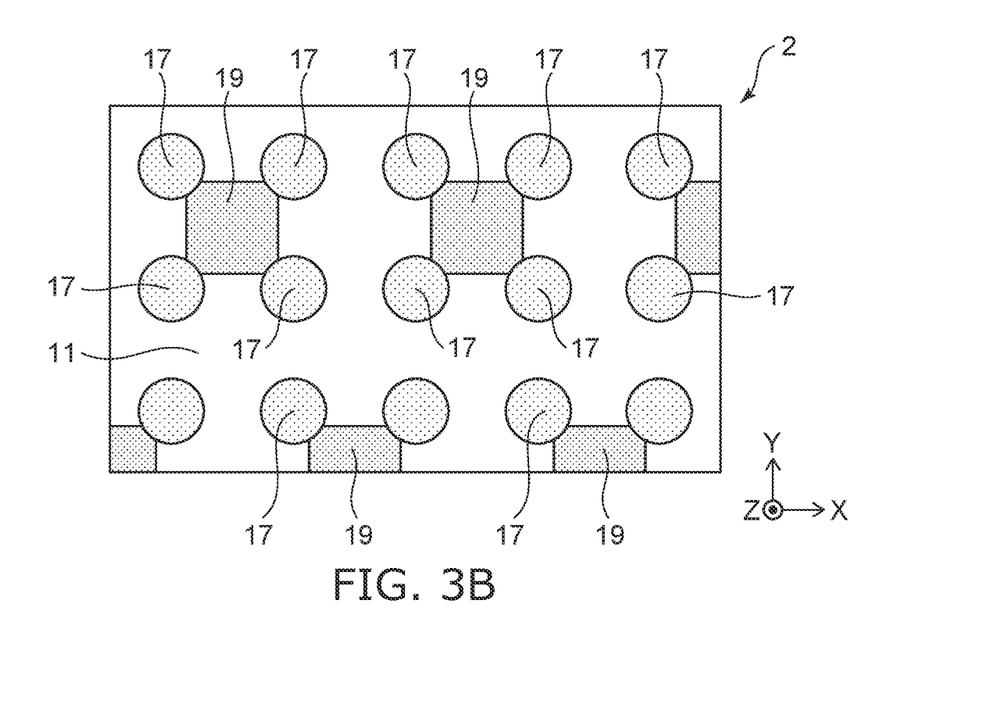

Next, a semiconductor device 2 according to a first variation of the embodiment will be described. FIGS. 3A and 3B are schematic plan views showing the semiconductor device 2 according to the first variation of the embodiment. FIG. 3A is a plan view showing a cross section along A-A line in FIG. 1. FIG. 3B is a plan view showing a cross section along B-B line in FIG. 1.

As shown in FIG. 3A, the control electrode 40 includes a first portion 40a and a second portion 40b. The first portion 40a extends, for example, in the X-direction. The second portion 40b extends, for example, in the Y-direction. The fourth semiconductor layer 17 is shown in the drawing by a dashed line. The fourth semiconductor layer 17 is provided below a cross point of the first portion 40a and the second portion 40b. The multiple fourth semiconductor layers 17 each formed into an island shape are apart from each other. The fourth semiconductor layer 17 extends in the Z-direction and has, for example, a columnar shape (see FIG. 1).

The third semiconductor layer 15 and the sixth semiconductor layer 21 are provided in an area surrounded by the first portion 40a and the second portion 40b of the control electrode 40. The sixth semiconductor layer 21 is provided, for example, at a center of the area surrounded by the control electrode 40. The third semiconductor layer 15 surrounds the sixth semiconductor layer 21. The semiconductor part 10 further includes an eighth semiconductor layer 25 of the second conductive type. The eighth semiconductor layer 25 is provided at another area surrounded by the first portion 40a and the second portion 40b of the control electrode 40 and covers the whole area. The eighth semiconductor layer 25 is a p-type contact layer different from the sixth semiconductor layer 21.

As shown in FIG. 3B, the fifth semiconductor layer 19 is provided at a position surrounded by four fourth semiconductor layers 17. The fifth semiconductor layer 19 connects the four fourth semiconductor layers 17 therearound. The four fourth semiconductor layers 17 are electrically connected to each other via the fifth semiconductor layer 19.

Figure 4:
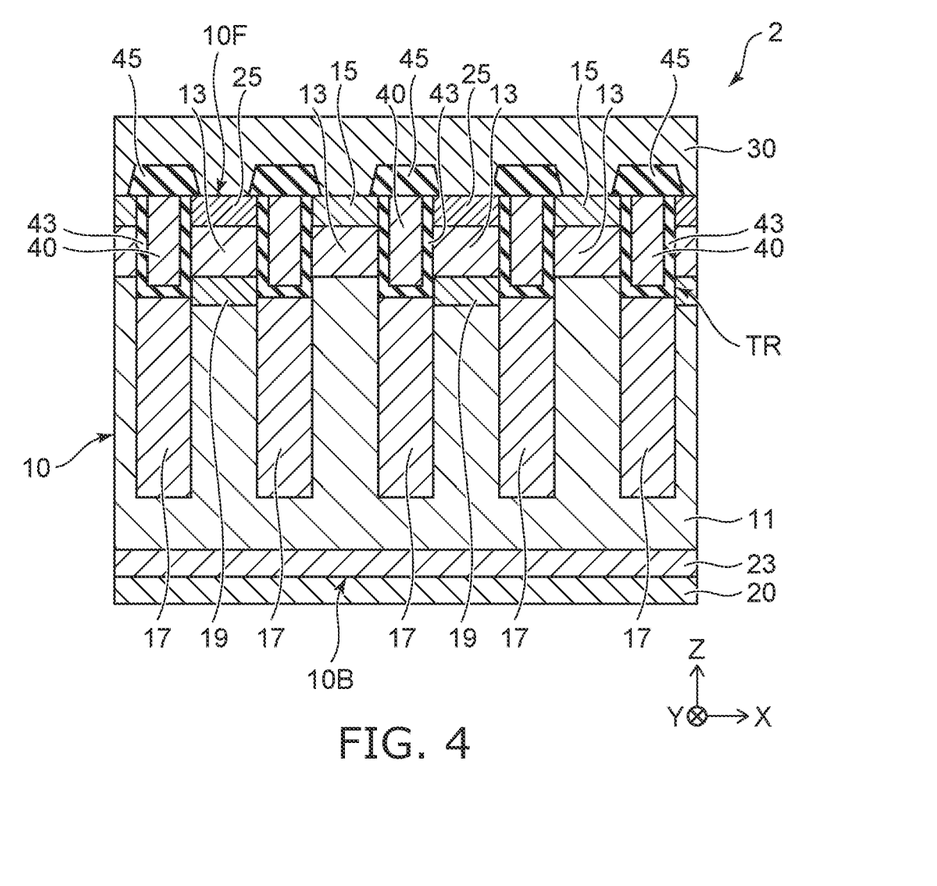
FIG. 4 is a schematic cross-sectional view showing the semiconductor device according to the first variation of the embodiment.

FIG. 4 is a schematic cross-sectional view showing the semiconductor device 2 according to the embodiment. FIG. 4 is a cross-sectional view along C-C line shown in FIG. 3A.

As shown in FIG. 4, the fifth semiconductor layer 19 is provided between the first semiconductor layer 11 and the second semiconductor layer 13. The fifth semiconductor layer 19 is partially provided on the first semiconductor layer 11. The eighth semiconductor layer 25 is provided between the second semiconductor layer 13 and the second electrode 30. The eighth semiconductor layer 25 is provided above the fifth semiconductor layer 19.

The fourth semiconductor layers 17 are electrically connected to the second semiconductor layer 13 via the fifth semiconductor layer 19. The second semiconductor layer 13 is electrically connected to the second electrode 30 via the eighth semiconductor layer 25. The eighth semiconductor layer 25 includes a second conductive type impurity with a concentration higher than the concentration of the second conductive type impurities in the second semiconductor layer 13.

Also in the example, by providing the fifth semiconductor layer 19, the switching speed is improved in the turn-off process, and the capacity for withstanding an avalanche current and a surge current is improved.

Figure 5A:
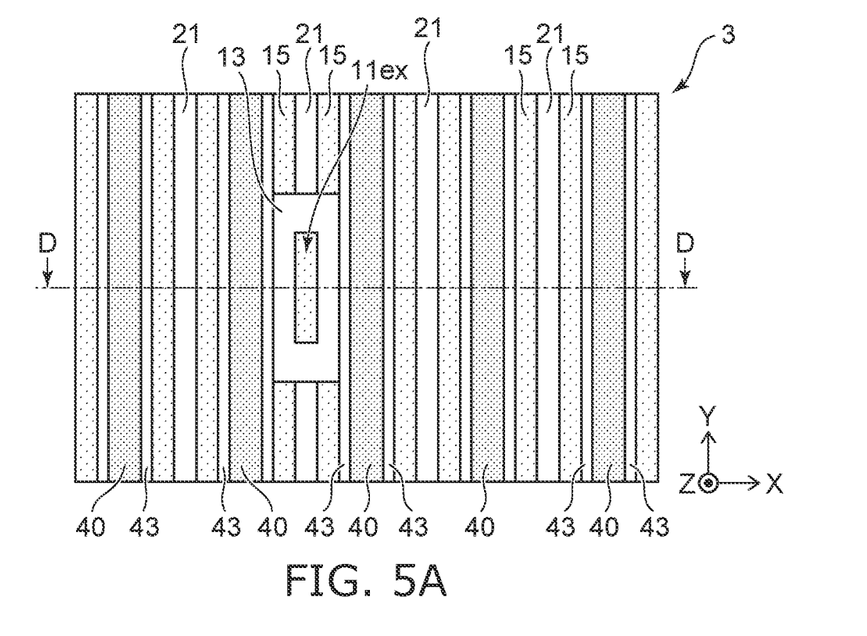
FIGS. 5A and 5B are schematic views showing a semiconductor device according to a second variation of the embodiment.
Figure 5B:
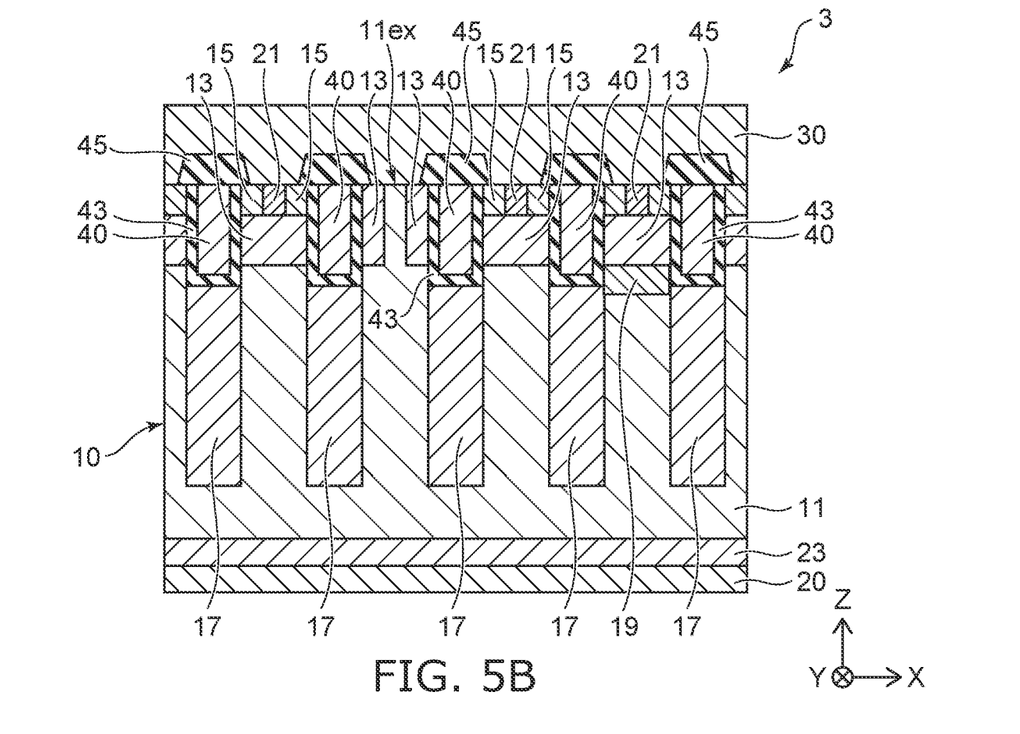

A semiconductor device 3 according to a second variation of the embodiment is described below. FIGS. 5A and 5B are schematic views showing the semiconductor device 3 according to the second variation of the embodiment. FIG. 5A is a plan view showing a cross section along A-A line shown in FIG. 1. FIG. 5B is a cross-sectional view along D-D line shown in FIG. 5A.

As shown in FIG. 5A, the multiple control electrodes 40 each extend in the Y-direction. The multiple control electrodes 40 are arranged in the X-direction. The third semiconductor layer 15 and the sixth semiconductor layer 21 are arranged in the X-direction between adjacent control electrodes 40. The third semiconductor layer 15 and the sixth semiconductor layer 21 each extend in the Y-direction along the control electrode 40. Further, between the adjacent control electrodes 40, the first semiconductor layer 11 and the second semiconductor layer 13 each include a portion dividing the third semiconductor layer 15 and the sixth semiconductor layer 21. The portion of the second semiconductor layer 13 surrounds the portion of the first semiconductor layer 11.

As shown in FIG. 5B, the first semiconductor layer 11 includes an extended portion 11ex extending into the second semiconductor layer 13 in the Z-direction. The extended portion 11ex contacts the second electrode 30. The second electrode 30 is connected to the extending portion 11ex of the first semiconductor layer 11 at the front surface 10F of the semiconductor part 10. The second electrode 30 is contacts the extending portion 11ex with, for example, a Schottky junction.

As described above, the semiconductor device 3 includes the fifth semiconductor layer 19 that electrically connects the fourth semiconductor layers 17 and the second semiconductor layer 13. In the semiconductor device 3, an MOS transistor and an Schottky diode are integrated. By providing the Schottky diode, for example, it is possible to prevent the characteristic degradation due to crystal defects extending under a bipolar operation. Whereas the crystal defects are generated more likely in SiC as compared with silicon (Si), it is possible to prevent the characteristic degradation by providing the Schottky diode. Thus, in the semiconductor device 3, the high breakdown voltage provided by SiC and suppressing the characteristic degradation can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first electrode;
a second electrode apart from the first electrode;
a semiconductor part provided between the first electrode and the second electrode, the semiconductor part including first to fifth semiconductor layers,
the first semiconductor layer of a first conductive type extending between the first electrode and the second electrode,
the second semiconductor layer of a second conductive type being provided between the first semiconductor layer and the second electrode,
the third semiconductor layer of the first conductive type being partially provided on the second semiconductor layer between the second semiconductor layer and the second electrode,
a plurality of fourth semiconductor layers being provided in the first semiconductor layer, the fourth semiconductor layers being of the second conductive type, the fourth semiconductor layers each extending in a first direction directed from the first electrode toward the second electrode and being arranged in a second direction orthogonal to the first direction, the fourth semiconductor layers including a first fourth semiconductor layer and a second fourth semiconductor layer adjacent to each other, and
the fifth semiconductor layer of the second conductive type being provided between the first semiconductor layer and the second semiconductor layer, the fifth semiconductor layer being partially provided on the first semiconductor layer between the first fourth semiconductor layer and the second fourth semiconductor layer, the fifth semiconductor layer being in direct contact with the first fourth semiconductor layer and the second fourth semiconductor layer; and a control electrode provided between the second electrode and each of the fourth semiconductor layers, the control electrode facing the second semiconductor layer via a first insulating film.

2. The device according to claim 1, wherein
the first fourth semiconductor layer and the second fourth semiconductor layer are electrically connected to the second semiconductor layer via the fifth semiconductor layer.

3. The device according to claim 1, wherein
the fifth semiconductor layer includes a second conductive type impurity with a concentration higher than a concentration of a second conductive type impurity in the second semiconductor layer.

4. The device according to claim 1, wherein
the semiconductor part further includes a sixth semiconductor layer of the second conductive type partially provided on the second semiconductor layer between the second semiconductor layer and the second electrode, the third semiconductor layer and the sixth semiconductor layer being arranged along the second semiconductor layer, and
the second semiconductor layer is electrically connected to the second electrode via the sixth semiconductor layer.

5. The device according to claim 1, wherein
the semiconductor part further includes a seventh semiconductor layer of the first conductive type, the seventh semiconductor layer being provided between the first semiconductor layer and the first electrode, the seventh semiconductor layer including a first conductive type impurity with a concentration higher than a concentration of the first conductive type impurity in the first semiconductor layer, and
the first semiconductor layer includes a portion provided between the fourth semiconductor layers and the seventh semiconductor layer.

6. The device according to claim 1, wherein
the control electrode extends in a third direction orthogonal to the first direction and the second direction.

7. The device according to claim 6, wherein
the plurality of fourth semiconductor layers each extends in the third direction.

8. The device according to claim 1, wherein
the control electrode includes a first portion extending in the second direction and a second portion extending in a third direction orthogonal to the first direction and the second direction, and
the plurality of fourth semiconductor layers each are provided below a cross point of the first portion and the second portion of the control electrode.

9. The device according to claim 8, wherein
the plurality of fourth semiconductor layers each are provided in a columnar shape extending in the first direction.

10. The device according to claim 1, wherein
the first semiconductor layer extends into the second semiconductor layer in the first direction and includes an extended portion in contact with the second electrode.

11. The device according to claim 10, wherein
the second semiconductor layer surrounds the extended portion of the first semiconductor layer and is in contact with the second electrode.

12. The device according to claim 1, wherein
the third semiconductor layer is in contact with the first insulating film, and
the second semiconductor layer faces the control electrode via the first insulating film between the first semiconductor layer and the third semiconductor layer.

13. The device according to claim 1, wherein
the control electrode is provided inside a trench having an opening at the second electrode side of the semiconductor part, and is electrically insulated from the semiconductor part by a second insulating film.

14. The device according to claim 13, wherein
a plurality of the control electrodes are arranged in the second direction, and
the fifth semiconductor layer is partially provided on the first semiconductor later between two control electrodes adjacent to each other in the second direction.

* * * * *